United States Patent
Liu et al.

(10) Patent No.: US 12,278,234 B2
(45) Date of Patent: Apr. 15, 2025

(54) MULTI-FIN FINFET DEVICE INCLUDING EPITAXIAL GROWTH BARRIER ON OUTSIDE SURFACES OF OUTERMOST FINS AND RELATED METHODS

(71) Applicant: Bell Semiconductor, LLC, Chicago, IL (US)

(72) Inventors: Qing Liu, Irvine, CA (US); Prasanna Khare, Schenectady, NY (US); Nicolas Loubet, Guilderland, NY (US)

(73) Assignee: Bell Semiconductor, LLC, Chicago, IL (US)

( * ) Notice: Subject to any disclaimer, the term of this patent is extended or adjusted under 35 U.S.C. 154(b) by 0 days.

(21) Appl. No.: 18/171,914

(22) Filed: Feb. 21, 2023

(65) Prior Publication Data

US 2023/0197720 A1 Jun. 22, 2023

Related U.S. Application Data

(60) Continuation of application No. 17/365,682, filed on Jul. 1, 2021, now Pat. No. 11,610,886, which is a
(Continued)

(51) Int. Cl.
*H01L 27/088* (2006.01)
*H01L 21/225* (2006.01)
(Continued)

(52) U.S. Cl.
CPC ...... *H01L 27/0886* (2013.01); *H01L 21/2253* (2013.01); *H01L 21/26506* (2013.01);
(Continued)

(58) Field of Classification Search
CPC ............. H01L 27/0886; H01L 29/0847; H01L 29/41783; H01L 29/41791;
(Continued)

(56) References Cited

U.S. PATENT DOCUMENTS 7,449,373 B2  11/2008 Doyle et al.
7,482,663 B2   1/2009 Knoblinger et al.
(Continued)

FOREIGN PATENT DOCUMENTS

CN    203481242 U    3/2014
JP    2006-196821 A  7/2006
(Continued)

OTHER PUBLICATIONS

Brigham Young University, "Reactive Ion Etching (RIE) Etching Basics," retrieved from www.cleanroom.byu.edu/rieetching.phtml, 2012, 4 pages.
(Continued)

*Primary Examiner* — Matthew E Warren
(74) *Attorney, Agent, or Firm* — Mendelsohn Dunleavy, P.C.; Steve Mendelsohn

(57) ABSTRACT

A multi-fin FINFET device may include a substrate and a plurality of semiconductor fins extending upwardly from the substrate and being spaced apart along the substrate. Each semiconductor fin may have opposing first and second ends and a medial portion therebetween, and outermost fins of the plurality of semiconductor fins may comprise an epitaxial growth barrier on outside surfaces thereof. The FIN FET may further include at least one gate overlying the medial portions of the semiconductor fins, a plurality of raised epitaxial semiconductor source regions between the semiconductor fins adjacent the first ends thereof, and a plurality of raised epitaxial semiconductor drain regions between the semiconductor fins adjacent the second ends thereof.

21 Claims, 6 Drawing Sheets

Related U.S. Application Data continuation of application No. 16/751,036, filed on Jan. 23, 2020, now Pat. No. 11,069,682, which is a division of application No. 16/049,685, filed on Jul. 30, 2018, now Pat. No. 10,580,771, which is a continuation of application No. 15/209,662, filed on Jul. 13, 2016, now Pat. No. 10,062,690, which is a continuation of application No. 14/748,270, filed on Jun. 24, 2015, now Pat. No. 9,419,111, which is a division of application No. 13/590,756, filed on Aug. 21, 2012, now Pat. No. 9,093,556.

(51) Int. Cl.
| | |
|---|---|
| *H01L 21/265* | (2006.01) |
| *H01L 21/8234* | (2006.01) |
| *H01L 21/8238* | (2006.01) |
| *H01L 21/84* | (2006.01) |
| *H01L 29/08* | (2006.01) |
| *H01L 29/417* | (2006.01) |
| *H01L 29/66* | (2006.01) |
| *H01L 29/78* | (2006.01) |

(52) U.S. Cl.
CPC .... *H01L 21/26513* (2013.01); *H01L 21/2658* (2013.01); *H01L 21/26586* (2013.01); *H01L 21/823418* (2013.01); *H01L 21/823431* (2013.01); *H01L 21/823821* (2013.01); *H01L 21/845* (2013.01); *H01L 29/0847* (2013.01); *H01L 29/41783* (2013.01); *H01L 29/41791* (2013.01); *H01L 29/66795* (2013.01); *H01L 29/66803* (2013.01); *H01L 29/785* (2013.01)

(58) Field of Classification Search
CPC ......... H01L 29/66795; H01L 29/66803; H01L 29/785; H01L 21/2253; H01L 21/26506; H01L 21/26513; H01L 21/2658; H01L 21/26586; H01L 21/823418; H01L 21/823431; H01L 21/823821; H01L 21/845

See application file for complete search history.

(56) References Cited

U.S. PATENT DOCUMENTS

| | | | |
|---|---|---|---|
| 7,638,447 | B2 | 12/2009 | Bernard et al. |
| 7,638,843 | B2* | 12/2009 | Xiong .................. H01L 21/845 |
| | | | 257/401 |
| 7,829,951 | B2 | 11/2010 | Song et al. |
| 7,898,041 | B2 | 3/2011 | Radosavljevic et al. |
| 8,742,491 | B2 | 6/2014 | Lee |
| 2005/0148137 | A1 | 7/2005 | Brask et al. |
| 2005/0202608 | A1 | 9/2005 | Beintner |
| 2006/0071275 | A1 | 4/2006 | Brask et al. |
| 2006/0113605 | A1 | 6/2006 | Currie |
| 2006/0157749 | A1 | 7/2006 | Okuno |
| 2007/0259501 | A1 | 11/2007 | Xiong et al. |
| 2008/0048273 | A1 | 2/2008 | Lenoble |
| 2008/0067613 | A1 | 3/2008 | Anderson et al. |
| 2008/0277742 | A1* | 11/2008 | Hokazono ............. H01L 29/665 |
| | | | 257/E29.264 |
| 2010/0025767 | A1 | 2/2010 | Inaba |
| 2010/0065917 | A1 | 3/2010 | Ohta et al. |
| 2010/0203732 | A1 | 8/2010 | Doris et al. |
| 2010/0264497 | A1 | 10/2010 | Chang et al. |
| 2011/0068401 | A1 | 3/2011 | Izumida et al. |
| 2011/0101455 | A1 | 5/2011 | Basker et al. |
| 2011/0284967 | A1 | 11/2011 | Cheng et al. |

FOREIGN PATENT DOCUMENTS

| | | |
|---|---|---|
| JP | 2008-277416 A | 11/2008 |
| JP | 2009-537989 A | 10/2009 |
| JP | 2010-73869 A | 4/2010 |
| JP | 2011-71235 A | 4/2011 |
| JP | 2012-505552 A | 3/2012 |

OTHER PUBLICATIONS

Mishra et al., "FinFET Circuit Design," Nanoelectronic Circuit Design: 23-54, 2011.

Oehrlein et al., "Reactive Ion etching related Si surface residues and subsurface damage: Their 3 relationship to fundamental etching mechanisms," Journal of Vacuum Science & Technology A: Vacuum, Surfaces, and Films 5(4):1585-1594, 1987. (Abstract Only).

* cited by examiner

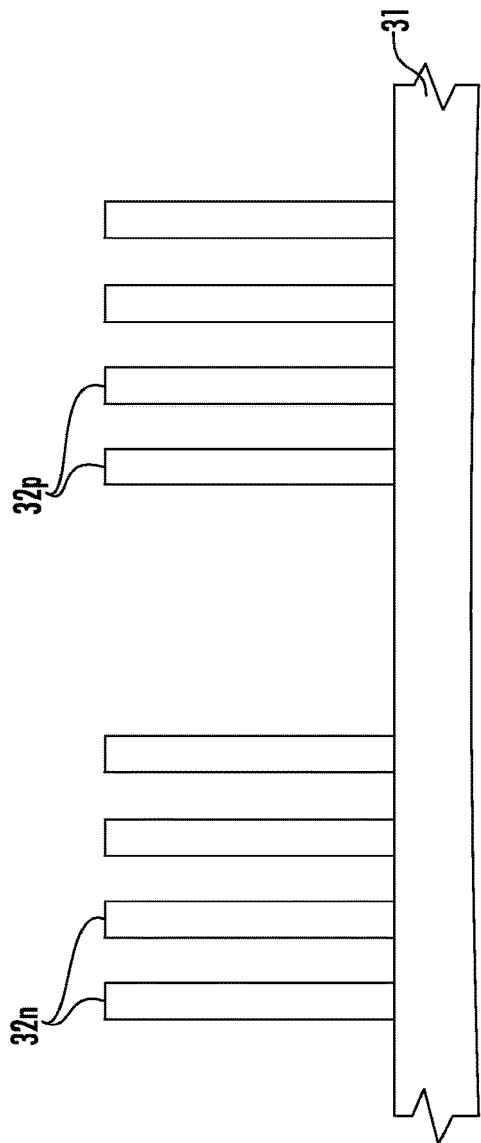
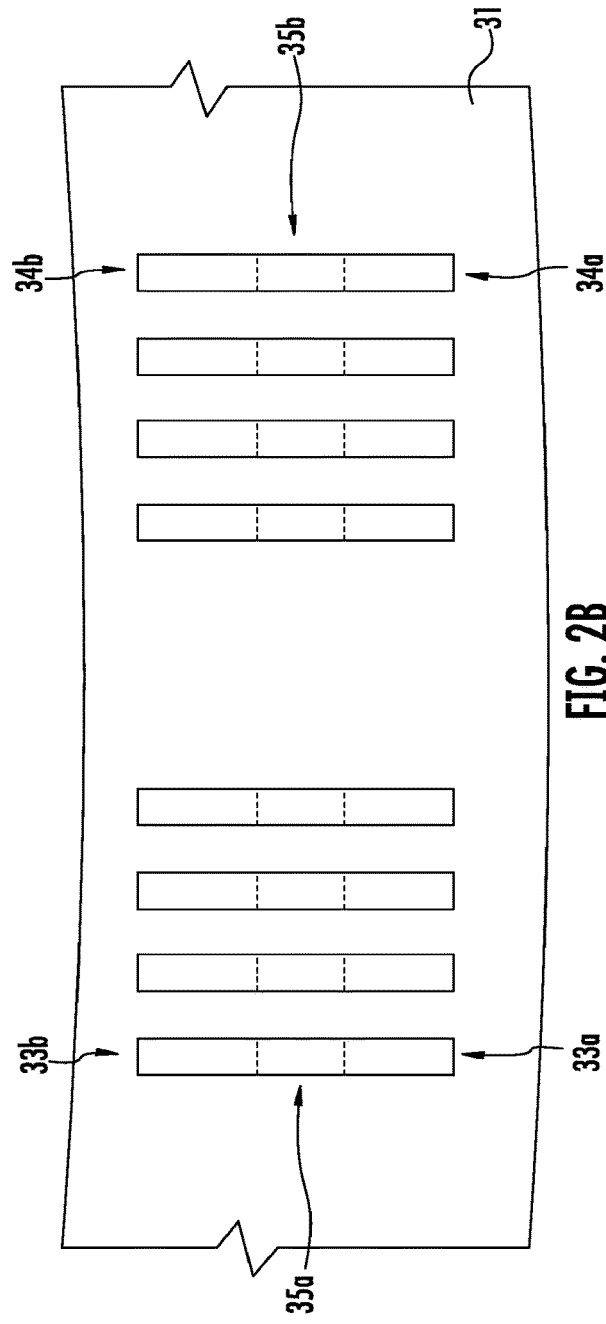
FIG. 2A
FIG. 2B

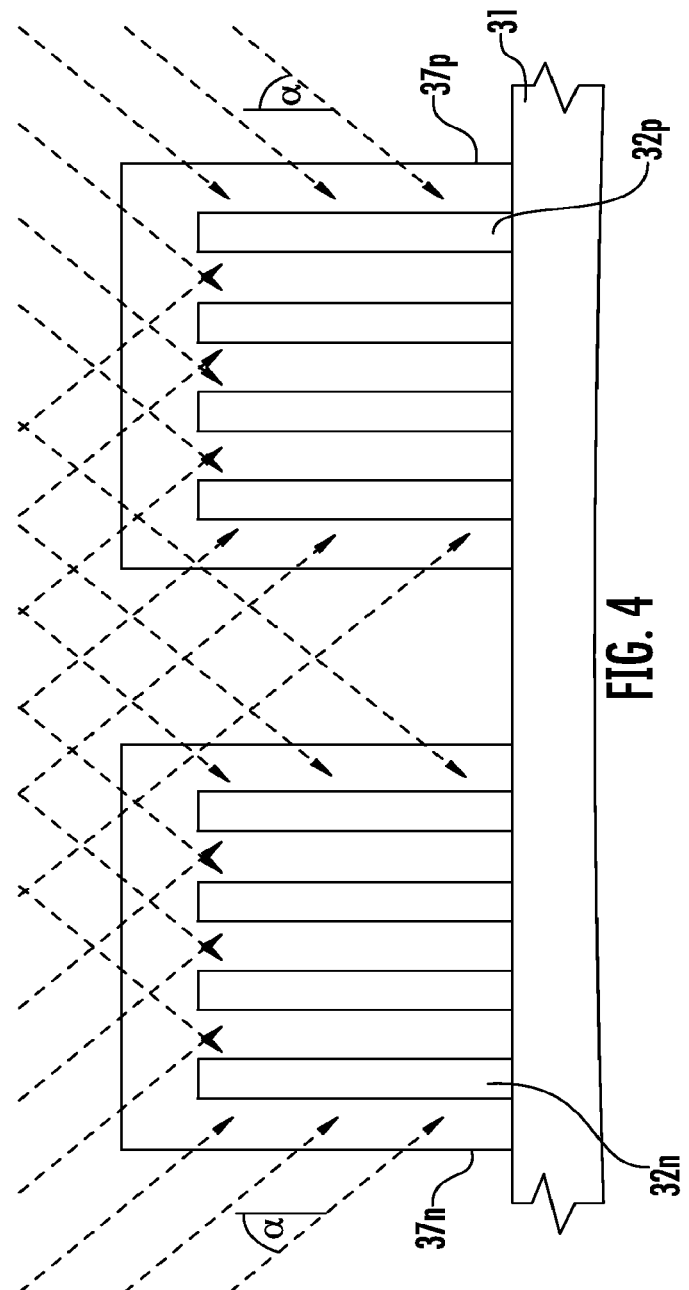

MULTI-FIN FINFET DEVICE INCLUDING EPITAXIAL GROWTH BARRIER ON OUTSIDE SURFACES OF OUTERMOST FINS AND RELATED METHODS

CROSS-REFERENCE TO RELATED APPLICATIONS

Continuation of application Ser. No. 17/365,682, filed on Jul. 1, 2021, which is a continuation of application Ser. No. 16/751,036, filed on Jan. 23, 2020, now U.S. Pat. No. 11,069,682, which is a division of application Ser. No. 16/049,685, filed on Jul. 30, 2018, now U.S. Pat. No. 10,580,771, which is a continuation of application Ser. No. 15/209,662, filed on Jul. 13, 2016, now U.S. Pat. No. 10,062,690, which is a continuation of application Ser. No. 14/748,270, filed on Jun. 24, 2015, now U.S. Pat. No. 9,419,111, which is a division of application Ser. No. 13/590,756, filed on Aug. 21, 2012, now U.S. Pat. No. 9,093,556, the teachings of which are incorporated herein by reference in their entirety.

FIELD OF THE INVENTION

The present invention relates to the field of electronic devices, and, more particularly, to semiconductor devices and related methods.

BACKGROUND OF THE INVENTION

Semiconductor device technologies continue to evolve, providing higher chip density and operating frequencies. Fin-type field-effect transistors (FINFETs) are one type of transistor technology that is being used to help provide desired device scaling while maintaining appropriate power consumption budgets.

U.S. Pat. Pub. No. 2010/0203732 discloses a FINFET device and related method, in which each FINFET may have a width of sub-lithographic dimension. The method includes forming a mask having a plurality of openings atop a semiconductor-containing layer which is located on a substrate. An angled ion implantation is then performed to introduce dopants to a first portion of the semiconductor-containing layer, wherein a remaining portion that is substantially free of dopants is present beneath the mask. The first portion of the semiconductor-containing layer containing the dopants is thereafter removed selective to the remaining portion of semiconductor-containing layer that is substantially free of the dopants to provide a pattern. The pattern is then transferred into the substrate to provide a fin structure having a width of sub-lithographic dimension.

Another type of FINFET device is the multi-fin FINFET. This device typically includes a plurality of spaced apart semiconductor fins with a tri-gate that overlies the fins. The effective gate width of a FINFET is 2 nh, where n is the number of fins and h is the fin height. Thus, wider transistors with higher on-currents may be obtained by using multiple fins. Yet, higher numbers of fins may result in more complicated devices structures that can pose challenges to fabricate.

SUMMARY OF THE INVENTION

In view of the foregoing background, it is therefore an object of the present invention to provide a multi-fin FINFET device that is reliable and readily fabricated.

This and other objects, features, and advantages in accordance with the present invention are provided by a multi-fin FINFET device which may include a substrate and a plurality of semiconductor fins extending upwardly from the substrate and being spaced apart along the substrate. Each semiconductor fin may have opposing first and second ends and a medial portion therebetween, and outermost fins of the plurality of semiconductor fins may comprise an epitaxial growth barrier on outside surfaces thereof. The FIN FET may further include at least one gate overlying the medial portions of the semiconductor fins, a plurality of raised epitaxial semiconductor source regions between the semiconductor fins adjacent the first ends thereof, and a plurality of raised epitaxial semiconductor drain regions between the semiconductor fins adjacent the second ends thereof. As such, epitaxial growth on the outside surfaces of the outermost fins may be avoided during growth of the raised epitaxial source and drain regions, which may advantageously result in a reduced likelihood of electrical shorting.

By way of example, the epitaxial growth barrier may comprise a compound comprising a semiconductor and at least one of carbon and fluorine. Furthermore, the plurality of semiconductor fins may comprise silicon, for example. More particularly, the plurality of semiconductor fins may comprise a first set of P-channel fins and a second set of N-channel fins spaced apart from the first set of P-channel fins to define a complementary metal-oxide semiconductor (CMOS) FINFET, and the at least one gate may comprise a respective gate for each of the first set of P-channel fins and the second set of N-channel fins.

The multi-fin FINFET device may further include a gate contact region coupled to the gate and extending upwardly from the substrate and spaced apart from the semiconductor fins. In addition, the multi-fin FINFET device may also include a source contact region coupled to the first ends of the plurality of semiconductor fins, and a drain contact region coupled to the second ends of the plurality of semiconductor fins.

A related method of making a multi-fin FINFET device may include forming a plurality of semiconductor fins extending upwardly from a substrate and being spaced apart along the substrate, where each semiconductor fin has opposing first and second ends and a medial portion therebetween. The method may further include forming at least one gate overlying the medial portions of the semiconductor fins, forming an epitaxial growth barrier on outside surfaces of outermost fins of the plurality of semiconductor fins, forming a plurality of raised epitaxial semiconductor source regions between the semiconductor fins adjacent the first ends thereof, and forming a plurality of raised epitaxial semiconductor drain regions between the semiconductor fins adjacent the second ends thereof.

BRIEF DESCRIPTION OF THE DRAWINGS

FIGS. 2A and 2B are side and top views, respectively, showing formation of the fins of the FINFET of FIG. 1.

FIG. 4 is a side view showing an ion implantation step to form epitaxial growth barriers on outside surfaces of the outermost fins of the FINFET of FIG. 1.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Referring initially to FIGS. 1-5, a multi-fin FINFET device 30 and associated method aspects are first described. In the illustrated example, the FINFET 30 is a complementary metal oxide semiconductor (CMOS) device including an NFET and a PFET. The FINFET 30 may be configured to provide various devices such as memories, logic gates, etc., using the contact regions described further below. However, it should be noted that non-CMOS configurations may be used in different embodiments as well (i.e., individual NFETs or PFETs).

Figure 5A:
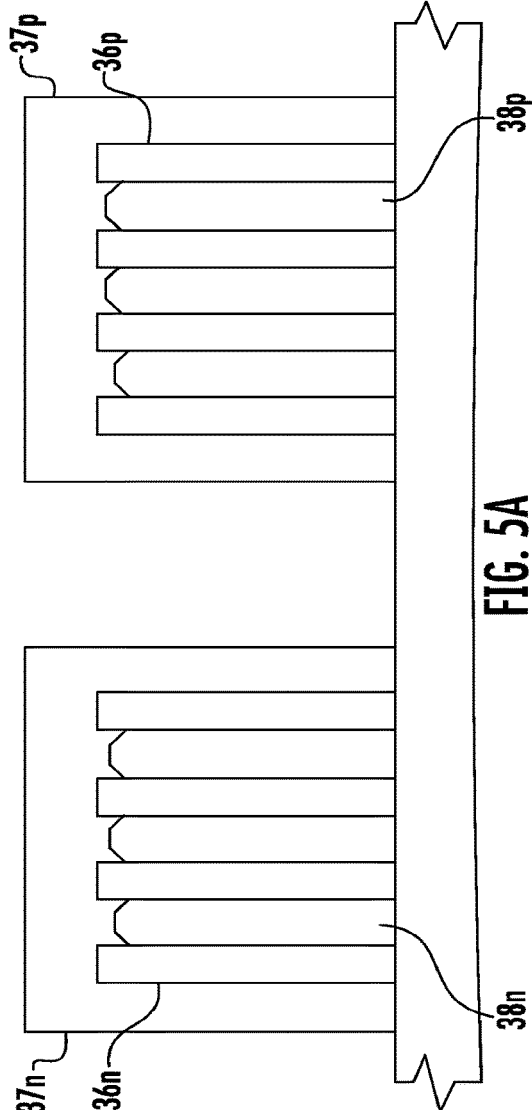
FIGS. 5A and 5B are side and top views, respectively, showing formation of epitaxial source and drain regions of the FINFET of FIG. 1.
Figure 5B:
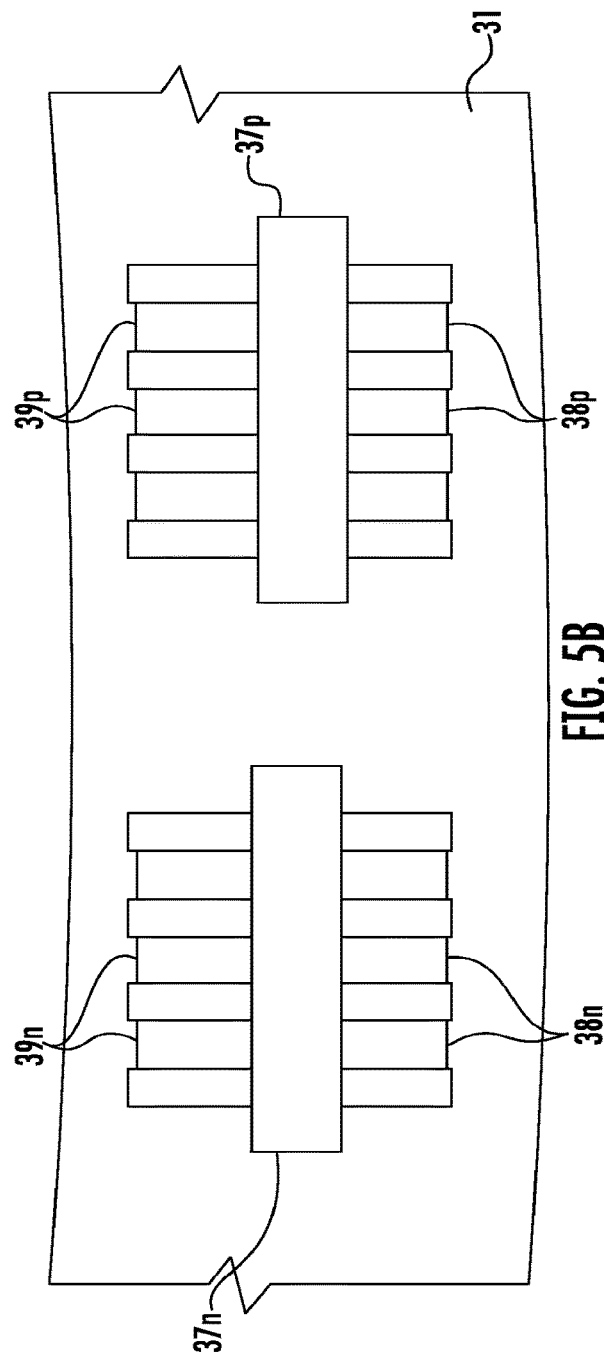

The FINFET 30 illustratively includes a substrate 31, which may be a semiconductor substrate (e.g., silicon, germanium, Si/Ge, etc.), a semiconductor on insulator (SOI) substrate, etc. Furthermore, a plurality of semiconductor fins 32n, 32p for respective NFET and PFET devices extend upwardly from the substrate 31, and are laterally spaced apart along the substrate (left to right in FIGS. 2A, 2B). In FIGS. 2A, to 5B, the NFET is on the left and the PFET is on the right. Each semiconductor fin 32n, 32p respectively has opposing first and second ends 33a, 33b and 34a, 34b, and a respective medial portion 35a, 35b therebetween (indicated with dashed lines in FIG. 2B). Outermost fins of the plurality of semiconductor fins (i.e., the fins 32n, 32p on the far left and right of their respective sets of fins) comprise an epitaxial growth barrier 35n, 35p on outside surfaces thereof, as will be described further below.

Figure 1:
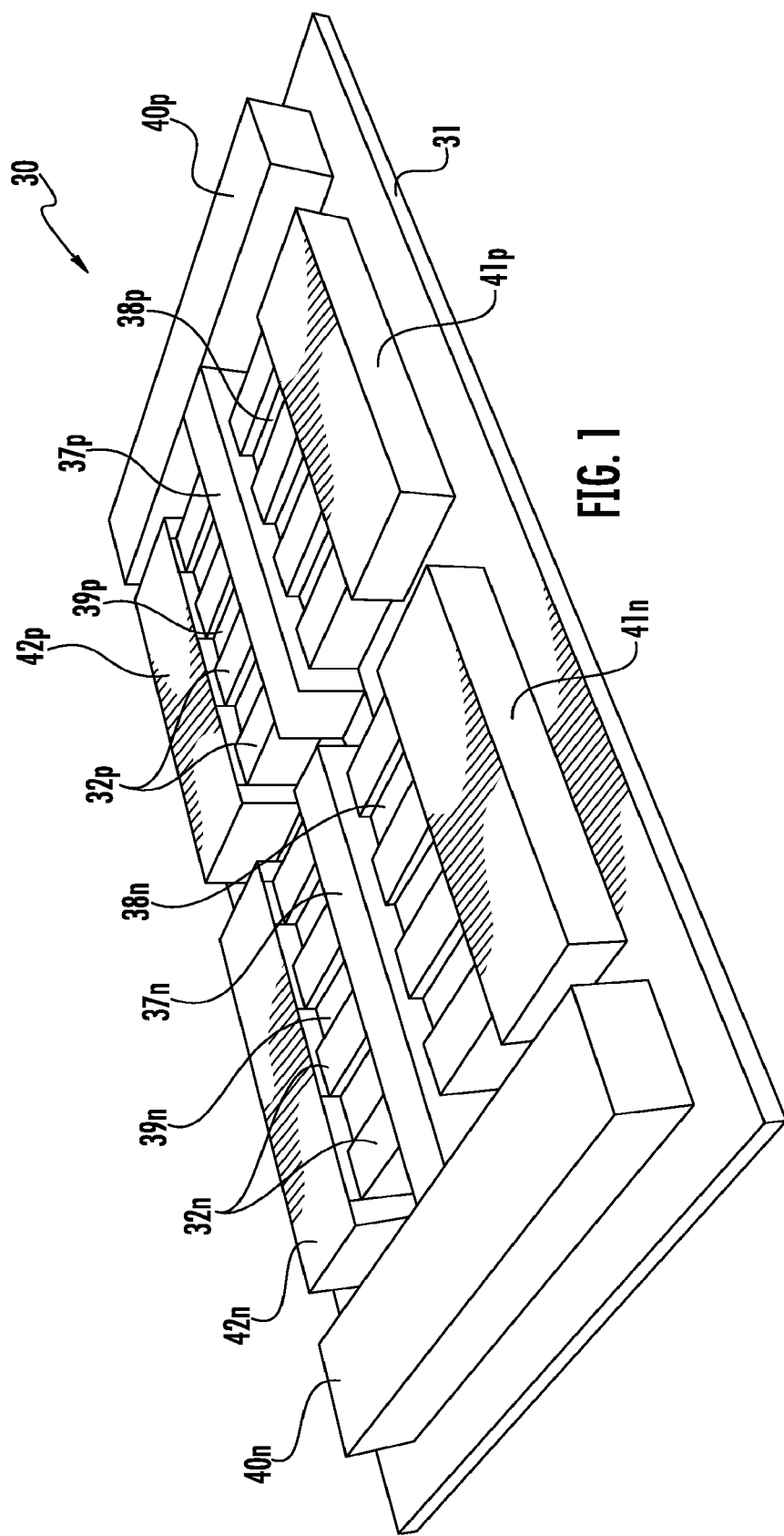
FIG. 1 is a perspective view of a CMOS multi-fin FINFET device in accordance with the invention.

The FINFET 30 further illustratively includes respective gates 37n, 37p for the NFET and PFET, which overlie the respective medial portions 35a, 35b of the fins 32n, 32p. More particularly, the gates 37n, 37p are tri-gate structures, each of which may include an insulator layer and an electrode layer overlying the insulator layer. In addition, a plurality of raised epitaxial semiconductor source regions 38n, 38p extend between the semiconductor fins 32n, 32p adjacent the first ends 33a, 34a thereof, respectively. Moreover, a plurality of raised epitaxial semiconductor drain regions 39n, 39p extend between the semiconductor fins 32n, 32p adjacent the second ends 33b, 34b thereof. The FINFET 30 further illustratively includes gate contact regions 40n, 40p respectively coupled to the gates 37n, 37p and extending upwardly from the substrate 31 and spaced apart from the semiconductor fins 40n, 40p (FIG. 1). Similarly, respective source contact regions 41n, 41p are coupled to the first ends 33a, 34a of the semiconductor fins 32n, 32p, and respective drain contact regions 42n, 42p are coupled to the second ends 33b, 34b of the semiconductor fins 32n, 32p.

As noted above, multi-fin FINFETs are advantageous in that the effective gate width is 2 nh, where n is the number of fins and h is the fin height. Accordingly, wider transistors with higher on-currents may be obtained by using multiple fins. However, when source/drain epitaxial growth is used to merge the fins 32n, 32p to lower the external resistance, epitaxial growth will otherwise occur between the two sets of fins. That is, not only is there intra-fin growth of the epitaxial semiconductor material between the fins 32n, and 32p, in a typical FIN FET integration process there will be inter-fin growth between the two sets of fins, for example. This may otherwise be problematic in that it can cause shorting between the NFET and PFET fins 32n, 32p. The above-noted epitaxial growth barriers 36n, 36p advantageously help constrain epitaxial growth to intra-fin growth to interior or inner fin surfaces between the fins 32n, 32p, and thus reduce a likelihood of shorting between the NFET and PFET devices.

Figure 3A:
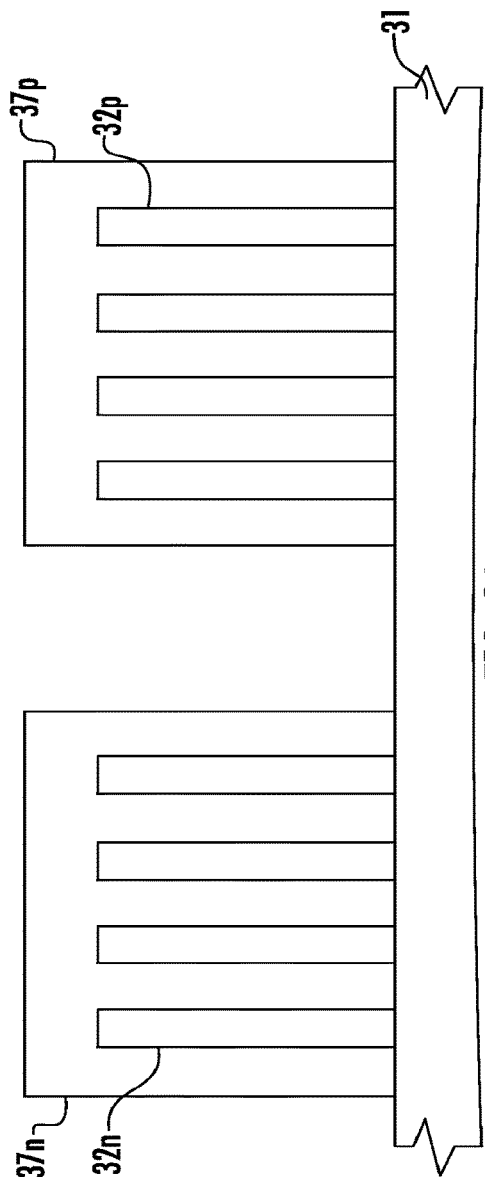
FIGS. 3A and 3B are side and top views, respectively, showing formation of tri-gates on the fins of the FINFET of FIG. 1.
Figure 3B:
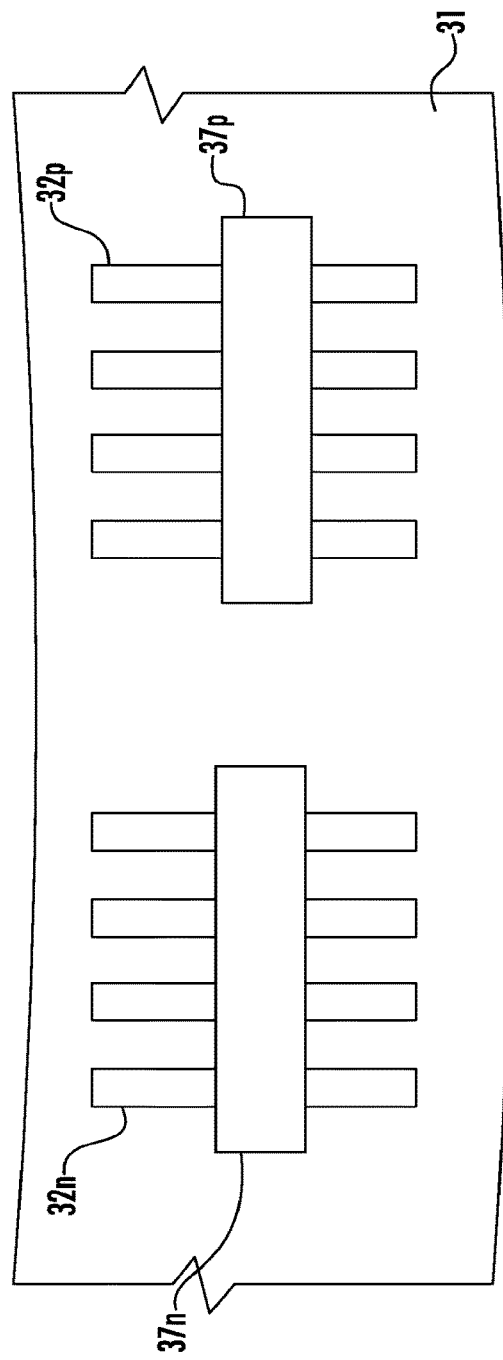
Figure 6:
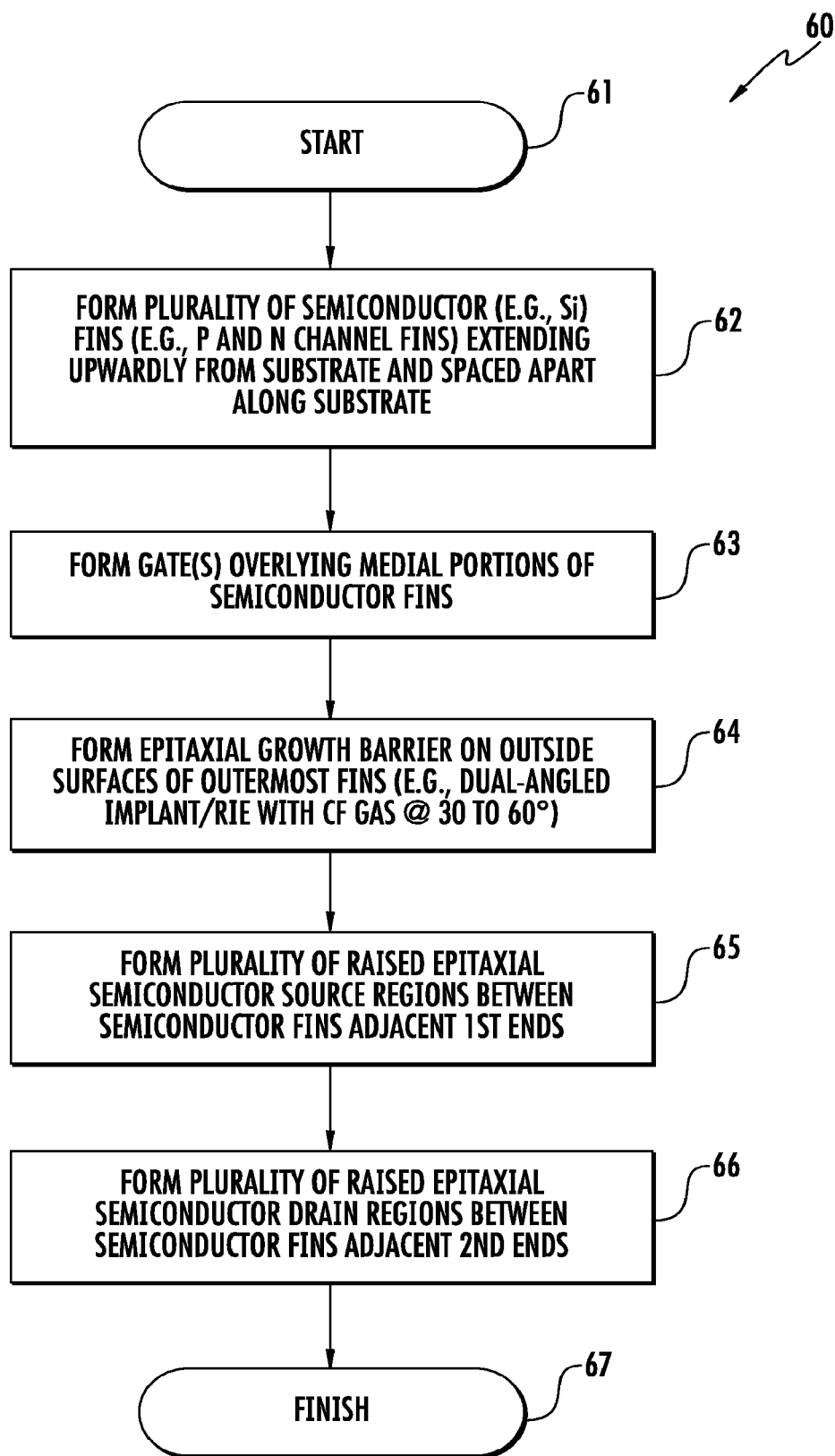
FIG. 6 is a flow diagram corresponding to the steps illustrated in FIGS. 2A, 2B, 3A, 3B, 4, 5A, and 5B.

An example approach for fabricating the FINFET 30 with the epitaxial growth barriers 36n, 36p will now be described further with reference to the flow diagram 60 of FIG. 6. Beginning at Block 61, the semiconductor (e.g., silicon, germanium, Si/Ge, etc.) fins 32n, 32p are formed extending upwardly from the substrate 31 and are spaced apart along the substrate, as noted above, at Block 62 (FIGS. 2A and 2B). The gates 37n, 37p are then formed overlying the medial portions 35a, 35b of the semiconductor fins 32n, 32p, respectively, at Block 63. Again, with a tri-gate structure, the gates 37n, 37p (which respectively include an insulator layer and a gate electrode layer) will wrap around the top and side surfaces of the fins 32n, 32p, as seen in FIGS. 3A, 3B.

The method further includes forming the epitaxial growth barriers 36n, 36p on outside surfaces of the outermost fins from the sets of fins 32n, 32p, as noted above, at Block 64. More particularly, this may be done by performing an ion implantation at an angle α offset from normal to the substrate 31, as represented by the dashed arrows in FIG. 4. More particularly, a dual-angled implant/reactive ion etch (RIE) may be performed using Carbon-Fluorine (e.g., CF4) or other suitable gases. As a result, the epitaxial growth barriers 36n, 36p will comprise a compound including the semiconductor fin material (e.g., silicon, etc.), carbon and/or fluorine components. The epitaxial growth barriers 36n, 36p will appear as a film or coating, and they will inhibit grow of epitaxial semiconductor material during formation of the raised source regions 38n, 38p and drain regions 39n, 39p, at Blocks 65-66 (FIGS. 5A, 5B), which illustratively concludes the method shown in FIG. 6 (Block 67).

The angle of implantation a may be chosen so as not to be too steep, and thereby allow ion penetration too deep between the fins 32n or 32p, yet not too shallow so that the outside surfaces of the sets of fins facing one another do not get coated on the bottom (which would allow excessive inter-fin epitaxial growth that could result in shorting between the NFET and PFET devices, as described above). Generally speaking, the angle of implantation a may be in a range of 30 to 60 degrees, depending upon the height and lateral spacing of the fins 32n, 32p which are used in a given embodiment. Because the inner surfaces of the fins 32n, 32p are blocked from ion bombardment by the adjacent fins, these inner surfaces will have relatively little impact or damage from the implantation, and will thereby still allow for the subsequent epitaxial source and drain growth. With proper angle selection only a small portion of these inner surfaces near the tops of the fins 32n, 32p will be impacted by the implantation and thereby have epitaxial growth barriers 36n, 36p formed thereon, as shown in FIGS. 4 and 5A.

It will therefore be appreciated that that the above-described approach may be relatively easy to implement, in that an additional step (i.e., the ion implantation) may be added to a multi-fin FINFET fabrication process to provide the epitaxial growth barriers 36n, 36p and reduce the likelihood of shorting in the finished device. That is, the above-described approach advantageously allows for relatively high density multi-fin configurations to be fabricated without the epitaxial merging between the NFETs and PFETs. The epitaxial growth barriers 36n, 36p may provide desired retardation of epitaxial growth, so that this growth is confined to the inner surfaces of the fins 32n, 32p where desired.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. A multi-fin FINFET device comprising:
   a substrate;
   a plurality of semiconductor fins extending upwardly from said substrate and being spaced apart along the substrate, each semiconductor fin having opposing first and second ends and a medial portion therebetween, outermost fins of said plurality of semiconductor fins comprising an epitaxial growth barrier on outside and top surfaces thereof and on portions of inner surfaces thereof adjacent the top surfaces, wherein the epitaxial growth barrier is not provided on an end surface of each end of each fin;
   at least one gate overlying the medial portions of said semiconductor fins;
   a plurality of raised epitaxial semiconductor source regions between said semiconductor fins adjacent the first ends thereof; and
   a plurality of raised epitaxial semiconductor drain regions between said semiconductor fins adjacent the second ends thereof.

2. The multi-fin FINFET device of claim 1, wherein said epitaxial growth barrier comprises a compound comprising a semiconductor and at least one of carbon and fluorine.

3. The multi-fin FINFET device of claim 2, wherein said semiconductor of said compound comprises silicon.

4. The multi-fin FINFET device of claim 1, wherein said plurality of semiconductor fins comprise silicon.

5. The multi-fin FINFET device of claim 1, wherein said plurality of semiconductor fins comprises a first set of P-channel fins and a second set of N-channel fins spaced apart from the first set of P-channel fins to define a complementary metal-oxide semiconductor FINFET.

6. The multi-fin FINFET device of claim 5, wherein said at least one gate comprises a respective gate for each of said first set of P-channel fins and said second set of N-channel fins.

7. The multi-fin FINFET device of claim 1, further comprising a gate contact region coupled to said gate and extending upwardly from said substrate and spaced apart from said semiconductor fins.

8. The multi-fin FINFET device of claim 1, further comprising:
   a source contact region coupled to the first ends of said plurality of semiconductor fins; and
   a drain contact region coupled to the second ends of said plurality of semiconductor fins.

9. The multi-fin FINFET device of claim 1, wherein the epitaxial growth barrier is not provided on the inner surfaces of the outermost fins other than at the top of the outermost fins.

10. The multi-fin FINFET device of claim 1, wherein the epitaxial growth barrier is not provided on the inner surfaces of any of the fins other than at the top of the fins.

11. A method of making a multi-fin FINFET device comprising:
    forming a plurality of semiconductor fins extending upwardly from a substrate and being spaced apart along the substrate, each semiconductor fin having opposing first and second ends and a medial portion therebetween,
    forming at least one gate overlying the medial portions of the semiconductor fins;
    forming an epitaxial growth barrier on top surfaces of the plurality of semiconductor fins, on outside surfaces of outermost fins of the plurality of semiconductor fins, and on portions of inner surfaces thereof adjacent the top surfaces, wherein the epitaxial growth barrier is not provided on an end surface of each end of each fin;
    forming a plurality of raised epitaxial semiconductor source regions between the semiconductor fins adjacent the first ends thereof; and
    forming a plurality of raised epitaxial semiconductor drain regions between the semiconductor fins adjacent the second ends thereof.

12. The method of claim 11, wherein forming the epitaxial growth barrier comprises performing an ion implantation at an angle offset from normal to the substrate.

13. The method of claim 12, wherein the angle is in a range of 30 to 60 degrees.

14. The method of claim 12, wherein performing the ion implantation comprises performing reactive ion etching using a carbon-fluorine gas.

15. The method of claim 11, wherein forming the epitaxial growth barrier comprises forming an epitaxial growth barrier comprising a semiconductor and at least one of carbon and fluorine.

16. The method of claim 11, wherein forming the plurality of semiconductor fins comprises forming a first set of P-channel fins and a second set of N-channel fins spaced apart from the first set of P-channel fins to define a complementary metal-oxide semiconductor FINFET.

17. The method of claim 16, wherein forming the at least one gate comprises forming a respective gate for each of the first set of P-channel fins and the second set of N-channel fins.

18. The method of claim 11, wherein the epitaxial growth barrier is not provided on the inner surfaces of the outermost fins other than at the top of the outermost fins.

19. The method of claim 11, wherein the epitaxial growth barrier is not provided on the inner surfaces of any of the fins other than at the top of the fins.

20. The method of claim 11, further comprising forming a gate contact region coupled to said gate and extending upwardly from said substrate and spaced apart from said semiconductor fins.

21. The method of claim 11, further comprising forming:
    a source contact region coupled to the first ends of said plurality of semiconductor fins; and a drain contact region coupled to the second ends of said plurality of semiconductor fins.

\* \* \* \* \*